(12) United States Patent
Ping

(10) Patent No.: US 6,583,006 B2
(45) Date of Patent: Jun. 24, 2003

(54) METHOD TO REDUCE FLOATING GRAIN DEFECTS IN DUAL-SIDED CONTAINER CAPACITOR FABRICATION

(75) Inventor: Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/073,235

(22) Filed: Feb. 13, 2002

(65) Prior Publication Data

US 2002/0142559 A1 Oct. 3, 2002

Related U.S. Application Data

(62) Division of application No. 09/146,104, filed on Sep. 3, 1998, now Pat. No. 6,383,886.

(51) Int. Cl.$^7$ ............................................. H01L 21/8242
(52) U.S. Cl. ..................... 438/253; 438/255; 438/398
(58) Field of Search ............................. 438/3, 253, 254, 438/255, 396, 397, 398

(56) References Cited

U.S. PATENT DOCUMENTS

| | | |
|---|---|---|
| 5,162,248 A | 11/1992 | Dennison et al. |
| 5,185,282 A | 2/1993 | Lee et al. |
| 5,284,787 A | 2/1994 | Ahn |
| 5,597,755 A | 1/1997 | Ajika et al. |
| 5,895,250 A | 4/1999 | Wu |
| 5,956,587 A | 9/1999 | Chen et al. |
| 6,015,733 A | 1/2000 | Lee et al. |
| 6,037,234 A | 3/2000 | Hong et al. |
| 6,063,656 A * | 5/2000 | Clampitt ..................... 257/306 |
| 2001/0012224 A1 * | 8/2001 | Schuegaraf ................. 365/200 |

* cited by examiner

*Primary Examiner*—Tuan H. Nguyen
(74) *Attorney, Agent, or Firm*—Dickstein Shapiro Morin & Oshinsky LLP

(57) ABSTRACT

A method for fabricating dual-sided container capacitors to prevent floating grain defects. A conductive container form is fabricated on a substrate. The container is then filled with photoresist. Chemical mechanical planarization is then performed. Surrounding insulative material is removed after removal of the photoresist within the container. By first removing the fill material, any remaining floating grains settle on the surface of the insulating material. Subsequent etchback of the insulating material removes the residual grains.

4 Claims, 17 Drawing Sheets

METHOD TO REDUCE FLOATING GRAIN DEFECTS IN DUAL-SIDED CONTAINER CAPACITOR FABRICATION

This application is a divisional of U.S. patent application Ser. No. 09/146,104, entitled "METHOD TO REDUCE FLOATING GRAIN DEFECTS IN DUAL SIDED CONTAINER CAPACITOR FABRICATION," filed Sep. 3, 1998, now U.S. Pat. No. 6,383,886, the entirety of which is hereby incorporated by reference.

FIELD OF THE INVENTION

The invention relates generally to integrated circuits and more particularly to a method for fabricating dual-sided container capacitors for such circuits.

BACKGROUND OF THE INVENTION

Capacitors are used in a wide variety of integrated circuits. Capacitors are of special concern in DRAM (dynamic random access memory) circuits; therefore, the invention will be discussed in connection with DRAM memory circuits. However, the invention has broader applicability and is not limited to DRAM memory circuits. It may be used in other types of memory circuits, such as SRAMs, as well as any other circuit in which capacitors are used.

DRAM memory circuits are manufactured by replicating millions of identical circuit elements, known as DRAM cells, on a single semiconductor wafer. A DRAM cell is an addressable location that can store one bit (binary digit) of data. In its most basic form, a DRAM cell consists of two circuit components: a storage capacitor and an access field effect transistor.

There is continuous pressure in the industry to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors.

Stacked capacitors are capacitors which are placed over the access transistor in a semiconductor device. In contrast, trench capacitors are formed in the substrate beneath the transistor. For reasons including ease of fabrication and increased capacitance, most manufacturers of DRAMs larger than 4 Megabits use stacked capacitors. Therefore, the present invention will be discussed in connection with stacked capacitors, but should not be understood to be limited thereto.

One widely used type of stacked capacitor is known as a container capacitor. Known container capacitors are in the shape of an upstanding tube (cylinder) with an oval or circular cross section. The wall of the tube consists of two electrodes, i.e., two plates of conductive material, such as doped polycrystalline silicon (referred to herein as polysilicon or poly), separated by a dielectric. The bottom end of the tube is closed, with the outer wall in contact with either the drain of the access transistor or a plug which itself is in contact with the drain. The other end of the tube is open. The sidewall and closed end of the tube form a container; hence the name "container capacitor."

One type of container capacitor is a "dual-sided" capacitor. A dual-sided container capacitor is a capacitor in which the bottom electrode forms a container, and the dielectric and top electrode layers cover not only the bottom electrode on the inside of the container but also cover at least a portion of the outside of the container walls. This dual-sided configuration enhances the efficiency of container capacitors by increasing the capacitance for a given container cell area.

Although container capacitors improved upon planar capacitors, they are not without their problems. During the fabrication of the bottom electrode layer of a dual-sided container capacitor, it is not uncommon that residual conductive material such as polysilicon may remain on the substrate around the edge of the container. These polysilicon residues, sometimes called floaters, are conductive and, thus, can cause floating grain defects, i.e., short circuits between adjacent container capacitors in the memory array. A typical container capacitor array which suffers from a floating grain defect problem, causing a short circuit between two capacitors, is shown in FIG. 1. What is needed is a method for fabricating dual-sided container capacitors which reduces or eliminates floating grain defects.

SUMMARY OF THE INVENTION

The present invention provides a method for fabricating dual-sided container capacitors, which minimizes or prevents floating grain defects, as shown in FIG. 2. According to the method of the present invention, after forming a container opening and a bottom electrode, the container is filled with photoresist or other fill material. Chemical mechanical planarization is then performed to isolate the bottom electrode. Adjacent insulative material is not removed to expose the outside of the bottom electrode, however, until after removal of the fill material. By removing the fill material first, and then etching back the insulative material, any remaining floating conductive grains from the fill material removal step settle on the surface of the insulative material. When the insulative material is subsequently removed, so are the remaining conductive grains and, thus, floating grain defects are prevented or minimized. A capacitor dielectric layer and a top electrode layer are then deposited to complete the dual-sided container capacitor.

DETAILED DESCRIPTION OF THE PREFERRED EMBODIMENTS

An example of a fabrication process for a dual-sided container capacitor according to one embodiment of the present invention is described below. It is to be understood, however, that this process is only one example of many possible capacitor configurations and processes utilizing the fabrication method of the invention. For example, in the process described below, photoresist is used as a fill material. Alternatively, an oxide, organic compound, resin or any other suitable material may be used. In addition, in the process described below the bit line is formed over the capacitor. A buried bit-line process could also be used. As another example, the plugs under the capacitors formed by the following process could be eliminated. Also, dry or wet etching could be used rather than chemical mechanical polishing. The invention is not intended to be limited by the particular process described below.

The term dual-sided capacitor, as used herein, shall be understood to mean a capacitor having a bottom electrode having at least two sides that emit, collect or deflect electric charge carriers, and which, at each of its two sides, opposes a corresponding electrode with a dielectric material disposed between each side of the bottom electrode and a corresponding electrode. The term dielectric as used herein shall be understood to mean any solid, liquid or gaseous material that can sustain an electrical field for use in the capacitor of a DRAM cell or other integrated circuit device containing a capacitor. The term "substrate" herein shall be understood to mean one or more semiconductive layers or structures which may include active or operable portions of semiconductor devices.

Figure 3:
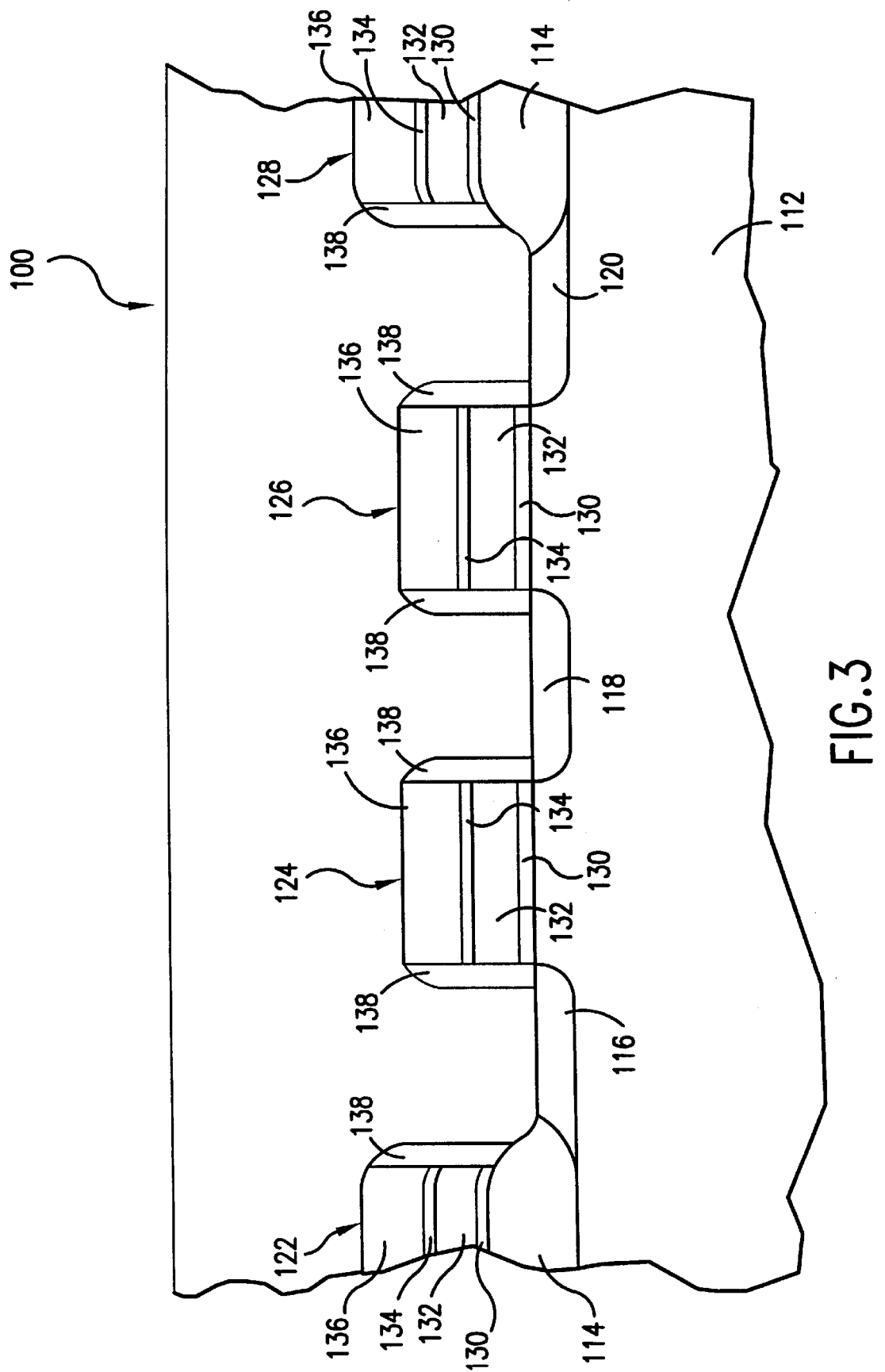
FIG. 3 is a diagrammatic cross-sectional view taken along a portion of a semiconductor wafer at an early processing step according to one embodiment of the present invention.

Referring to FIG. 3, a semiconductor wafer fragment at an early processing step is indicated generally by reference numeral 100. The semiconductor wafer 100 is comprised of a bulk silicon substrate 112 with field isolation oxide regions 114 and active areas 116, 118, 120. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, also of silicon nitride.

Two FETs are depicted in FIG. 3. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed.

Figure 4:
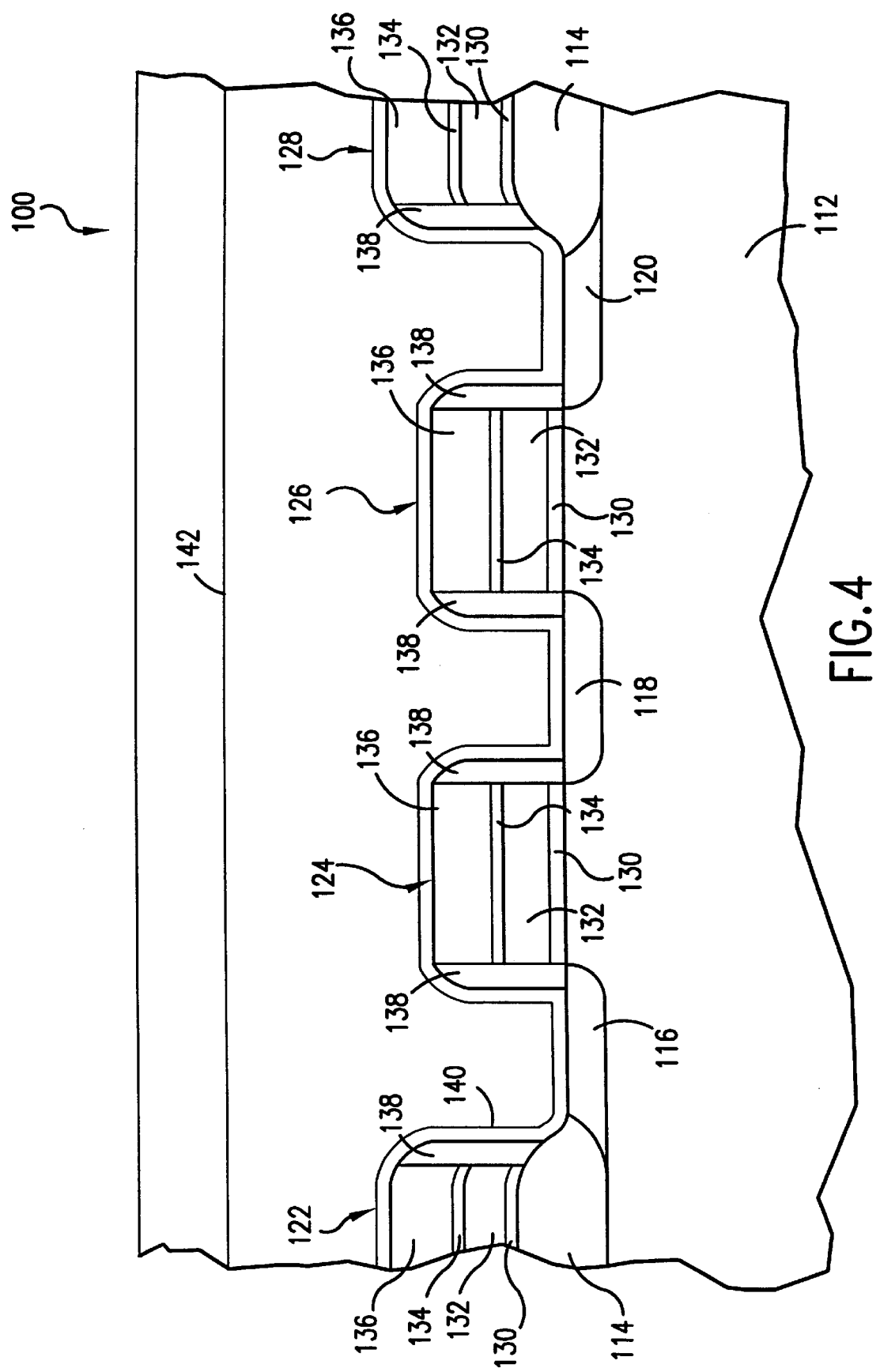
FIG. 4 is a diagrammatic cross-sectional view of a portion of a semiconductor wafer at a processing step subsequent to that shown in FIG. 3.

Referring to FIG. 4, a thin layer 140 of nitride or TEOS is provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 5:
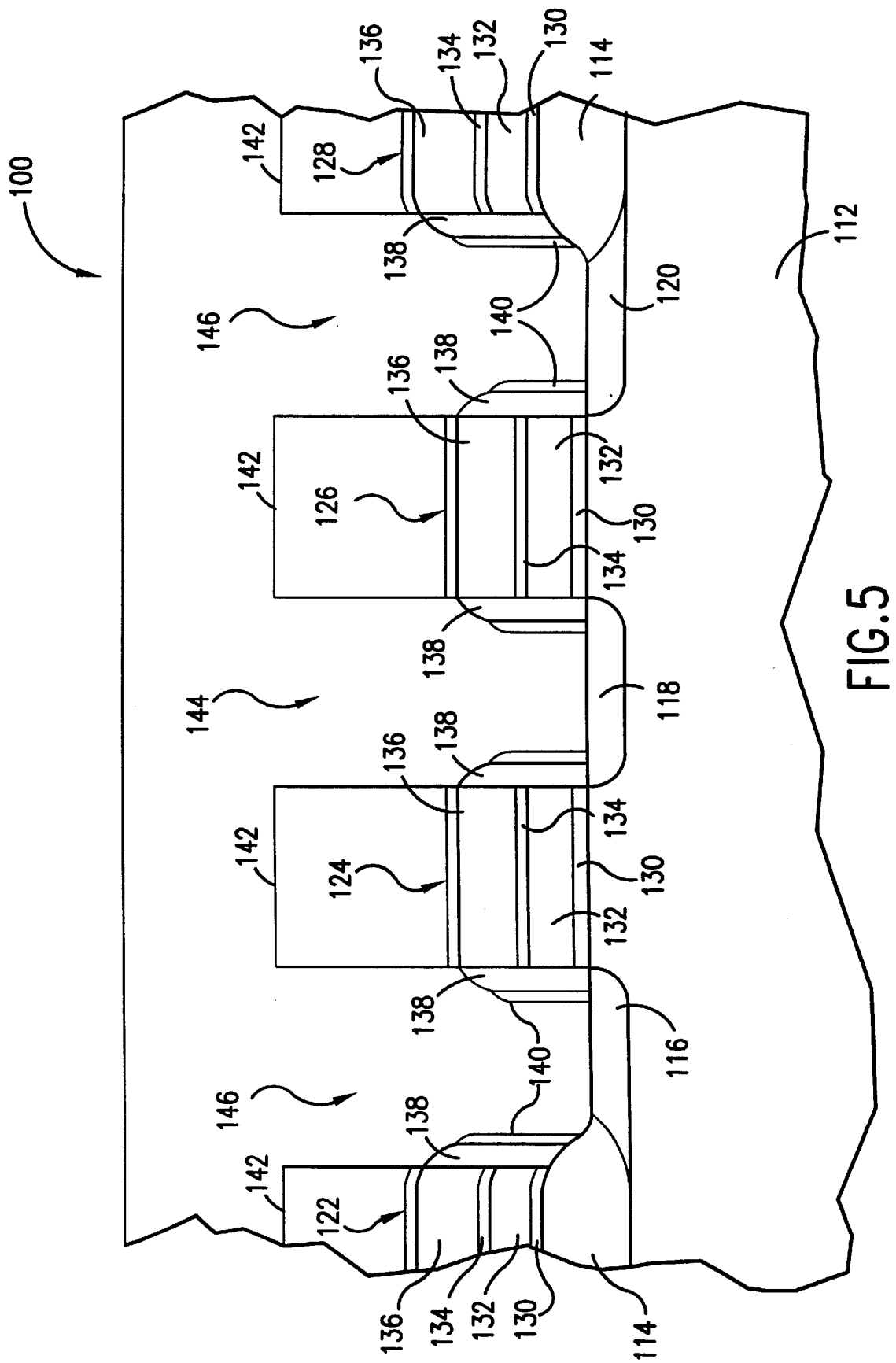
FIG. 5 is a diagrammatic cross-sectional view of a portion of a semiconductor wafer at a processing step subsequent to that shown in FIG. 4.
Figure 6:
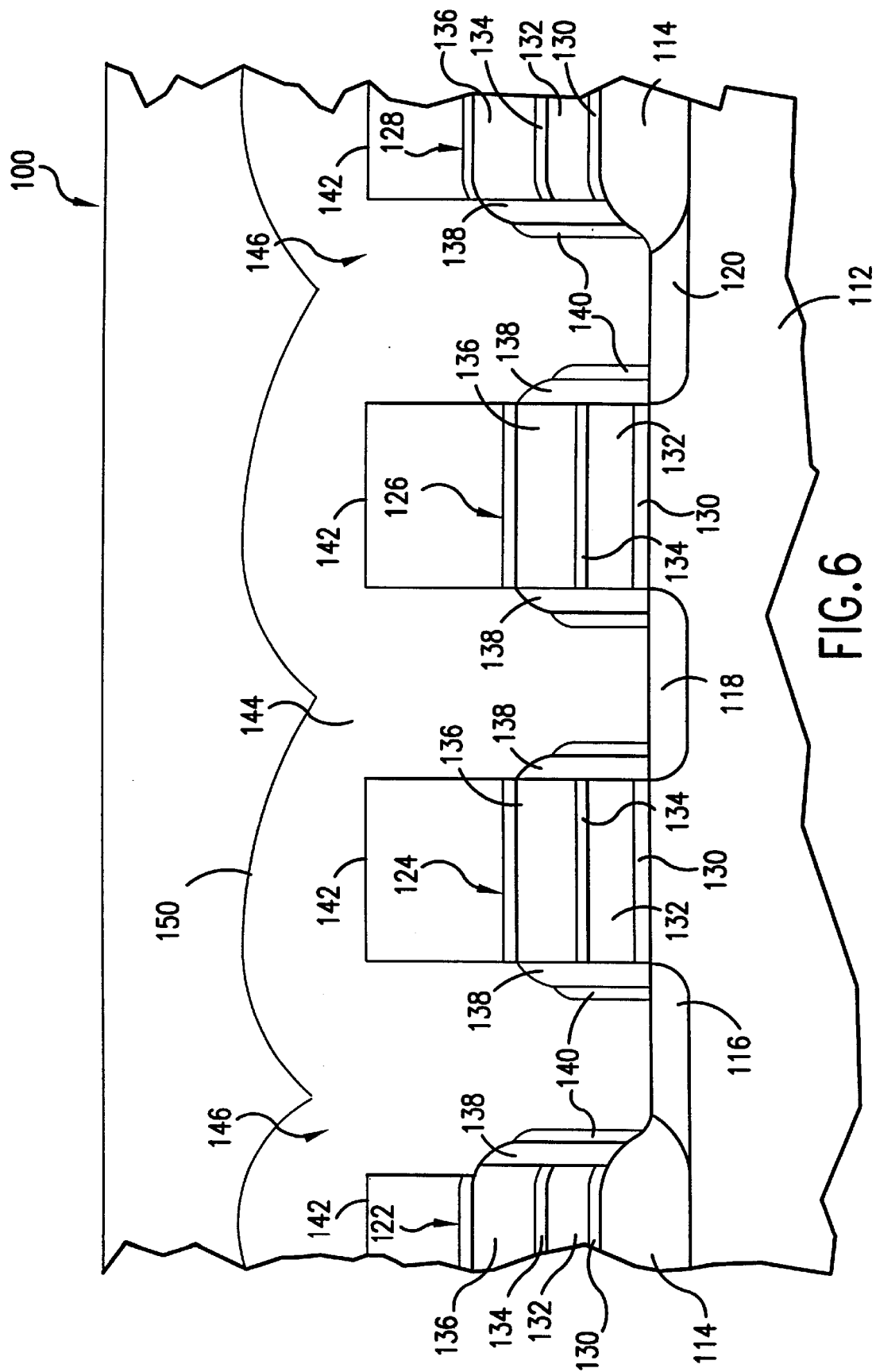
FIG. 6 is a diagrammatic cross-sectional view of a portion of a semiconductor wafer at a processing step subsequent to that shown in FIG. 5.
Figure 7:
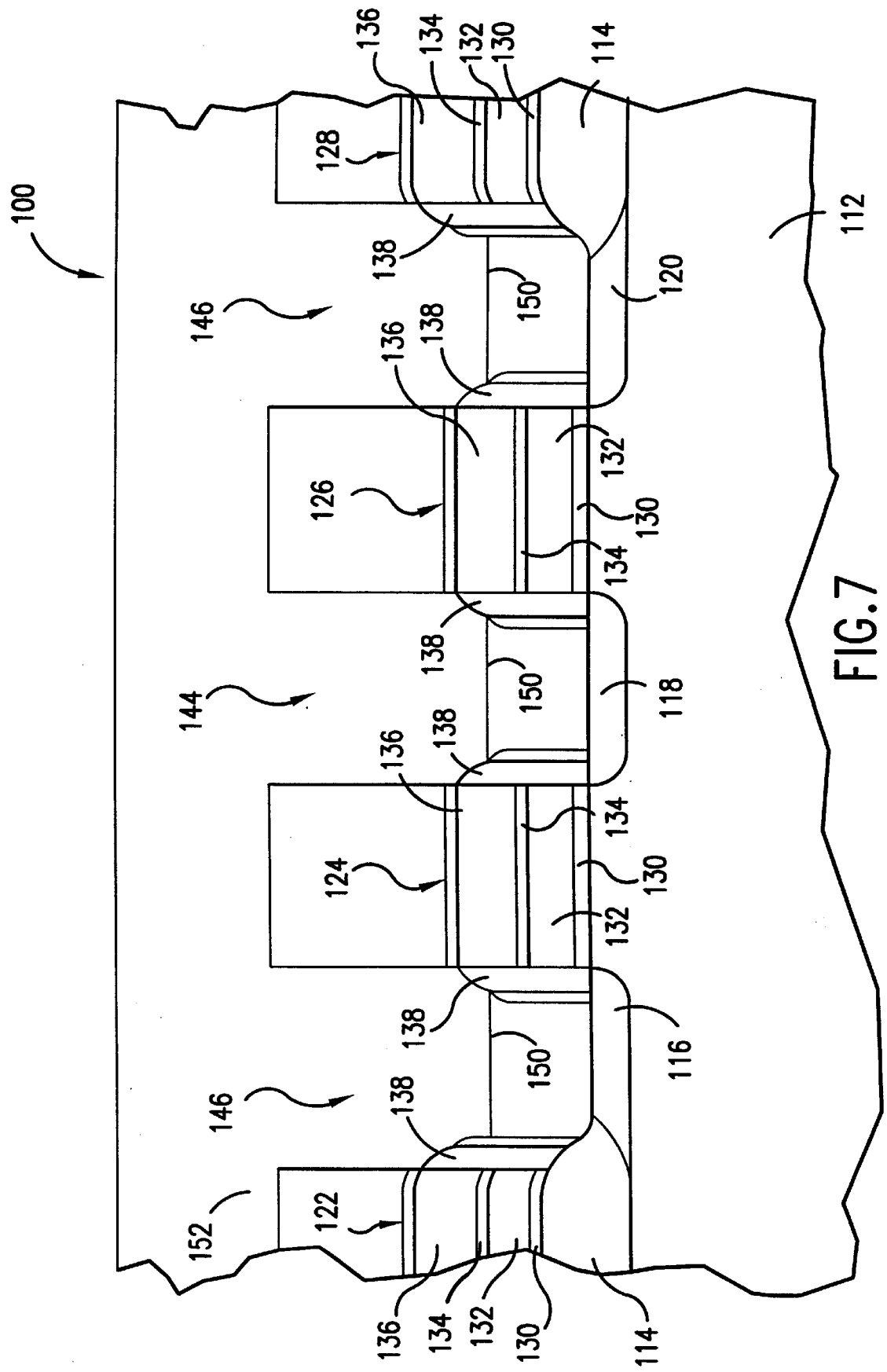
FIG. 7 is a diagrammatic cross-sectional view of a portion of a semiconductor wafer at a processing step subsequent to that shown in FIG. 6.

Referring to FIG. 5, a bit line contact opening 144 and capacitor openings 146 have been formed through the insulating layer 142. The openings 144, 146 are formed through the insulating layer 142 by photomasking and dry chemical etching the BPSG relative to the thin nitride layer 140. Referring now to FIG. 6, a layer 150 of conductive material is deposited to provide conductive material within the bit line contact and capacitor openings 144, 146. The conductive layer 150 is in contact with the active areas 116, 118, 120. An example of the material used to form layer 150 is in situ arsenic or phosphorous doped poly. Referring now to FIG. 7, the conductive layer 150 is etched away to the point that the only remaining material forms plugs 150 over the active areas 116, 118, 120.

Figure 8:
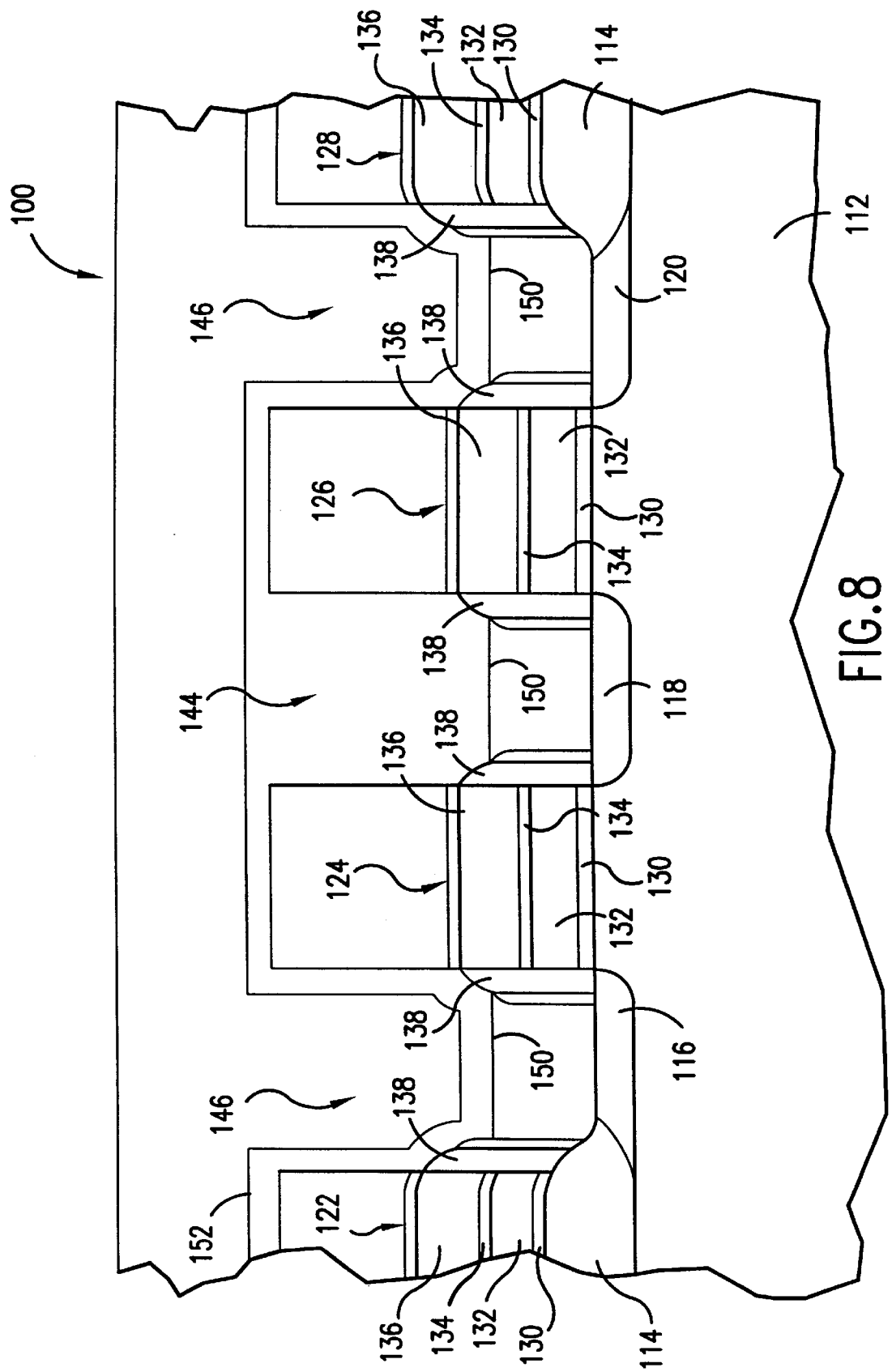
FIG. 8 is a diagrammatic cross-sectional view of a portion of a semiconductor wafer at a processing step subsequent to that shown in FIG. 7.

Referring to FIG. 8, a layer 152 of conductive material that will eventually form one of the electrodes of the capacitor is deposited at a thickness such that the bit line contact and capacitor openings 144, 146 are not closed off. The conductive material 152 may be any suitable conductive material, such as polysilicon or metal. Suitable metals may include, for example, ruthenium and/or platinum. Also, the layer of conductive material 152 may be formed as a multi-layer coating of conductive materials, such as a first layer of smooth polysilicon and a second layer of roughened, for example, hemisphericaliy-grained, polysilicon. Advantageously, the conductive layer 152 is a blanket polysilicon deposition that coats the sides and bottoms of the capacitor container openings 146 with polysilicon. Preferably, the layer 152 includes hemispherical grained poly (HSG) to increase capacitance. If HSG poly is to be used, the layer 152 may be formed by first depositing a layer of in situ doped polysilicon followed by a deposition of undoped HSG. Subsequent heating inherent in wafer processing will effectively conductively dope the overlying HSG layer. The conductive layer 152 may also be provided by in situ arsenic doping of an entire HSG layer. The conductive layer 152 is in electrical contact with the previously formed plugs 150.

Figure 9:
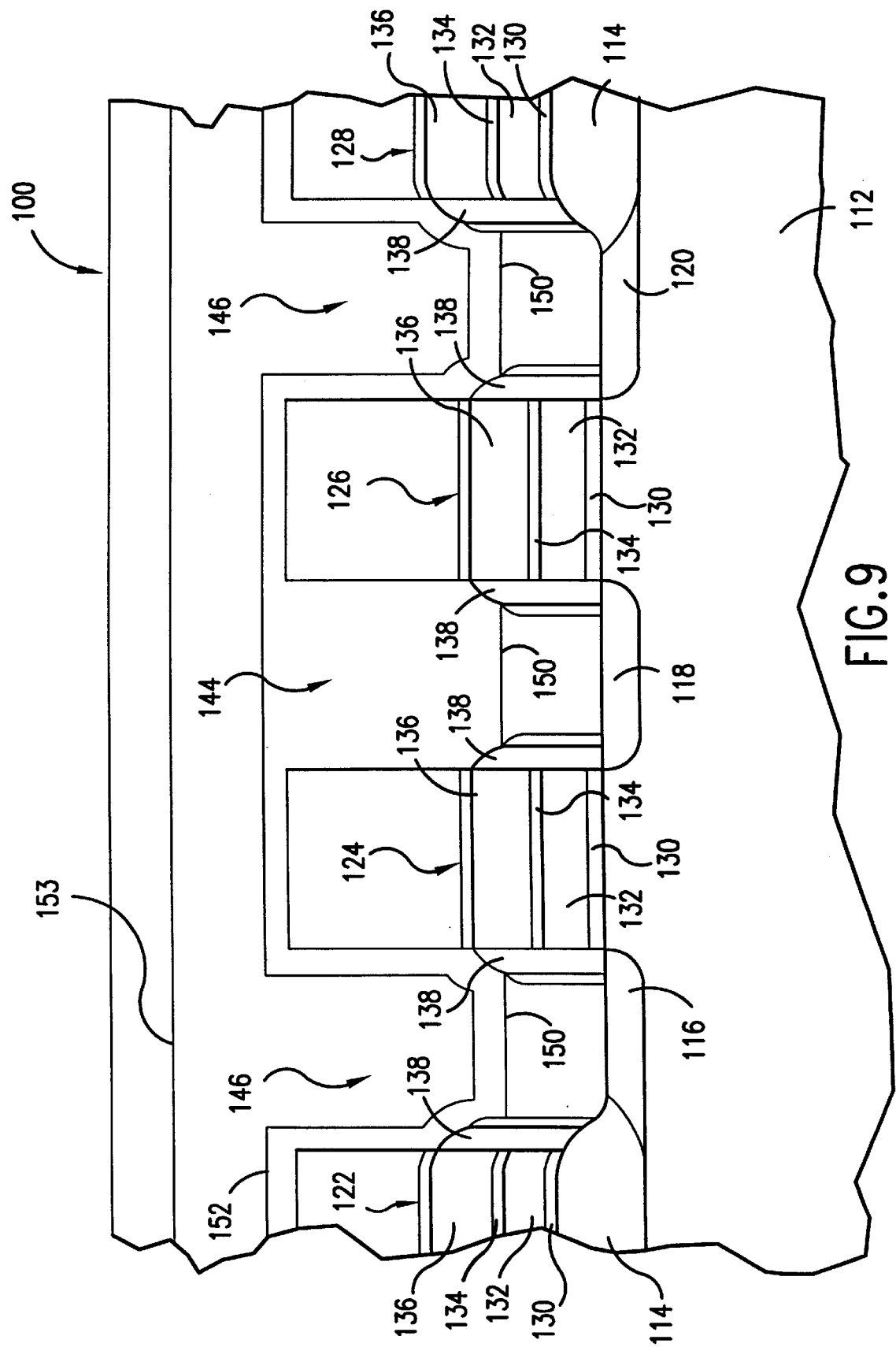
FIG. 9 is a diagrammatic cross-sectional view of a portion of a semiconductor wafer at a processing step subsequent to that shown in FIG. 8.

Once the conductive layer 152 has been deposited, a fill material layer 153 of, preferably, photoresist is deposited over the conductive layer 152 as shown in FIG. 9. The fill layer or photoresist 153 may be spun onto the conductive layer 152 and then baked to remove the solvent. Due to differential volume shrinkage, the thickness of the photoresist or fill layer 153 over the container openings 146 is typically less than the thickness of the layer 153 over areas that do not have containers. It should further be noted that the fill layer 153 need not be photosensitive. Indeed, any oxide, organic compound, resin or other fill material having suitable properties may also be utilized.

Figure 10:
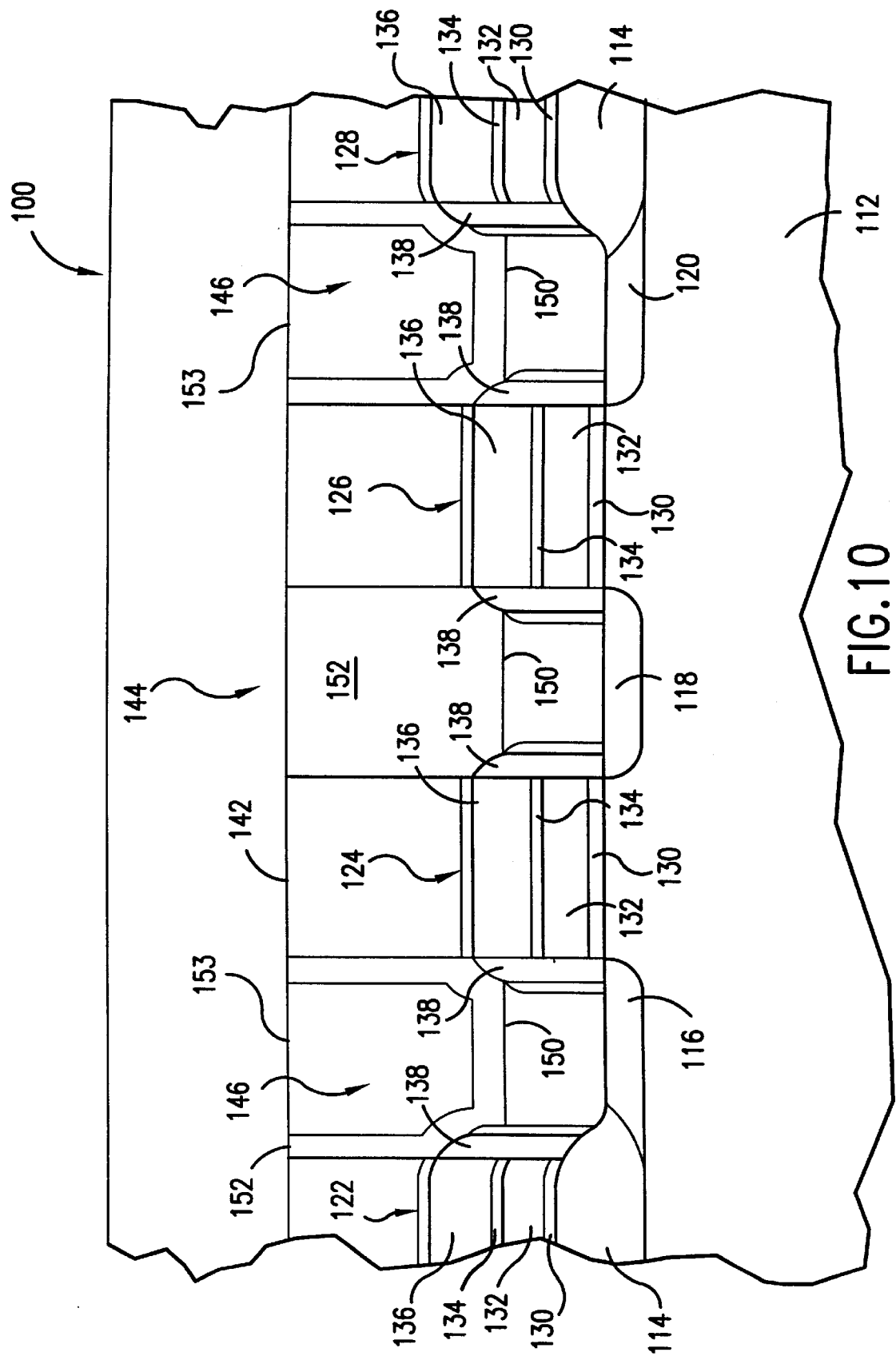
FIG. 10 is a diagrammatic cross-sectional view of a portion of a semiconductor wafer at a processing step subsequent to that shown in FIG. 9.

Referring to FIG. 10, the portion of the conductive layer 152 and fill layer 153 above the top of the BPSG layer 142 is removed, thereby electrically isolating the portions of layer 152 remaining in the bit line contact 144 and capacitor container openings 146. To remove the fill layer of photoresist 153 and the conductive layer 152 of polysilicon from the top surface 142 of the wafer 100, while leaving the photoresist and polysilicon in the container openings 146, a chemical-mechanical planarization (CMP) process is preferred. Accordingly, it should also be noted that one property of the type of material used to form the fill layer 153 that should be considered is the material's integrity through the chosen CMP process. Advantageously, the top surface 142 of the wafer 100 acts as a CMP stop to determine when the top surface 142 of the wafer 100 is clear of the conductive material 152 and photoresist 153. Instead of using the top surface 142 as a CMP stop, a timed CMP process may also be used. The CMP process produces the structure illustrated in FIG. 10. In addition, prior to this CMP process, any conductive material that may have been deposited on the backside of the substrate 112 may be removed by a suitable wet etch to prevent this conductive material from being dislodged during subsequent processing steps and being redeposited in undesirable locations.

Figure 11:
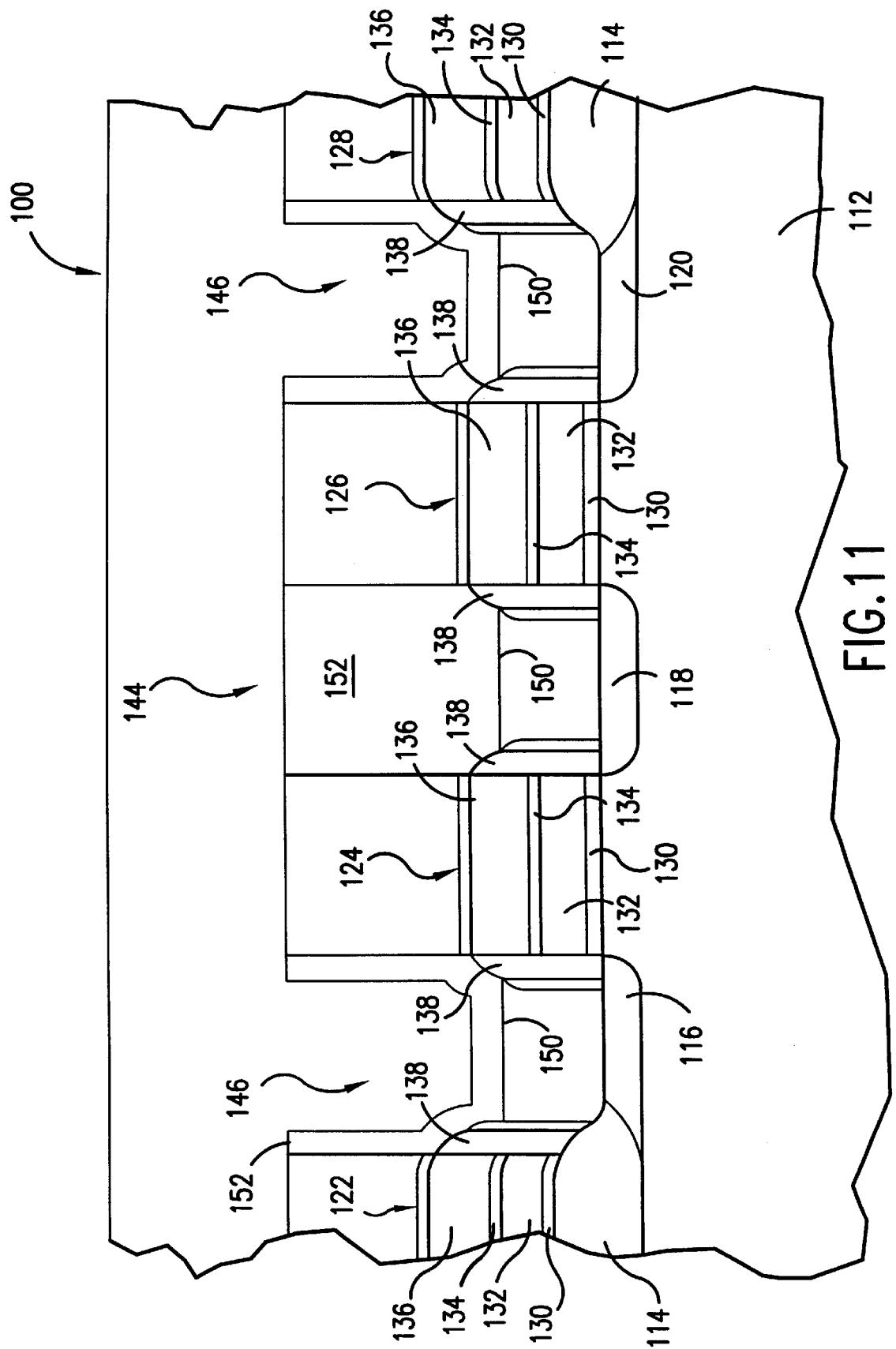
FIG. 11 is a diagrammatic cross-sectional view of a portion of a semiconductor wafer at a processing step subsequent to that shown in FIG. 10.
Figure 12:
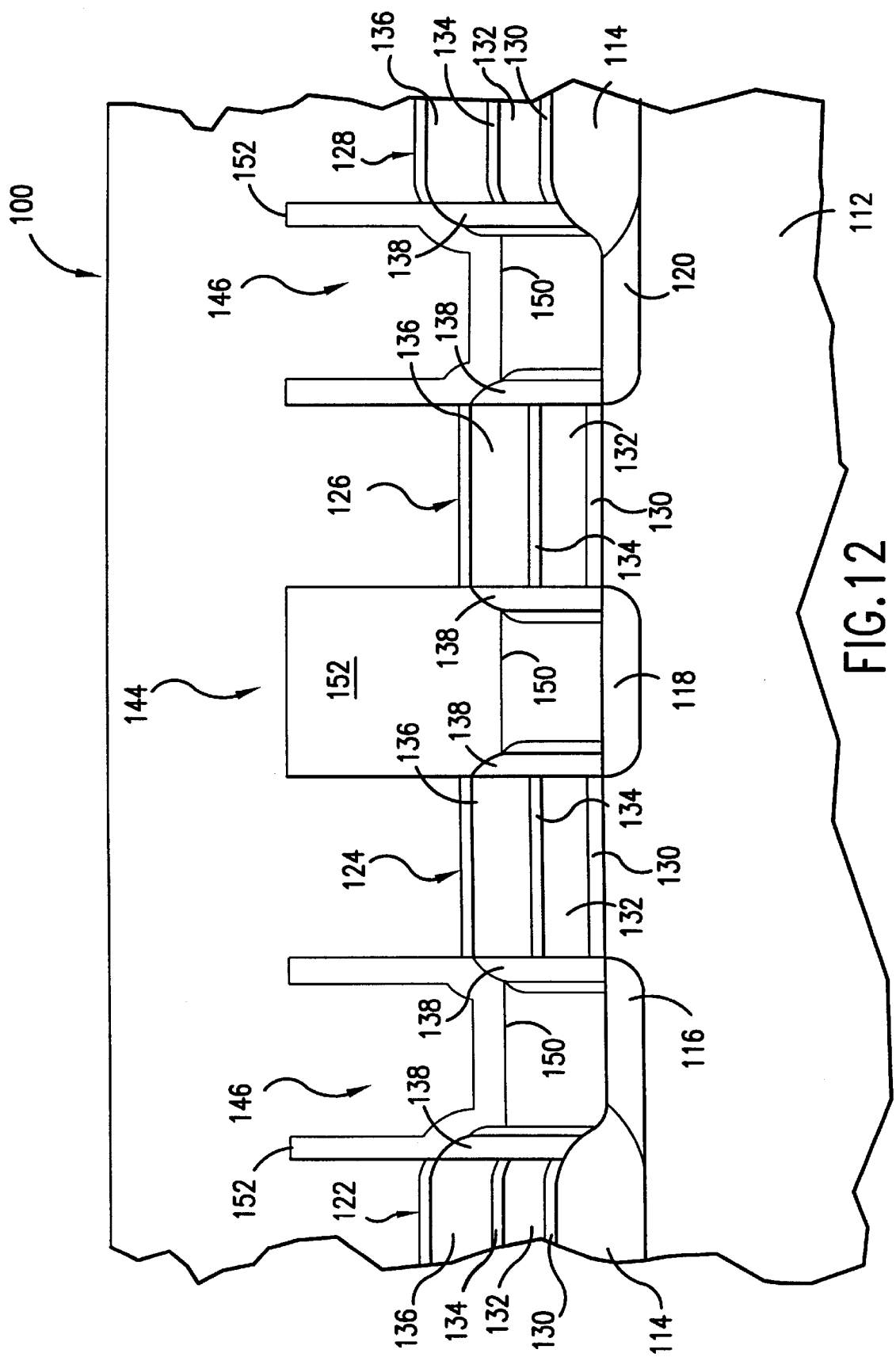
FIG. 12 is a diagrammatic cross-sectional view of a portion of a semiconductor wafer at a processing step subsequent to that shown in FIG. 11.

After the CMP process, the remaining fill layer 153 is then removed from the container to produce the structure illustrated in FIG. 11. Any suitable process may be used to remove the photoresist or other selected fill material layer 153 from the inside of the container. The insulating layer 142, which is preferably formed of BPSG, is then etched back around the conductive layer 152 in order to expose the outside of the conductive layer 152 as shown in FIG. 12. The insulating layer 142 is preferably removed by the use of an etchant containing a dilute solution of hydrofluoric acid (HF), such as a 10:1 volumetric ratio of water to 49% HF solution; however, the invention is not limited to this particular etchant. Any method of exposing conductive layer 152 or of removing the insulating layer 142 from around the conductive layer 152 is within the scope of the present invention. As discussed in more detail below, the removal of insulative layer 142 to expose the outside surface of conductive layer 152 after removing fill layer 153 from within the container opening 146 reduces or eliminates residual conductive material remaining between containers and, thus, reduces or eliminates short circuits caused by such residual material, i.e., floating grains.

Figure 13:
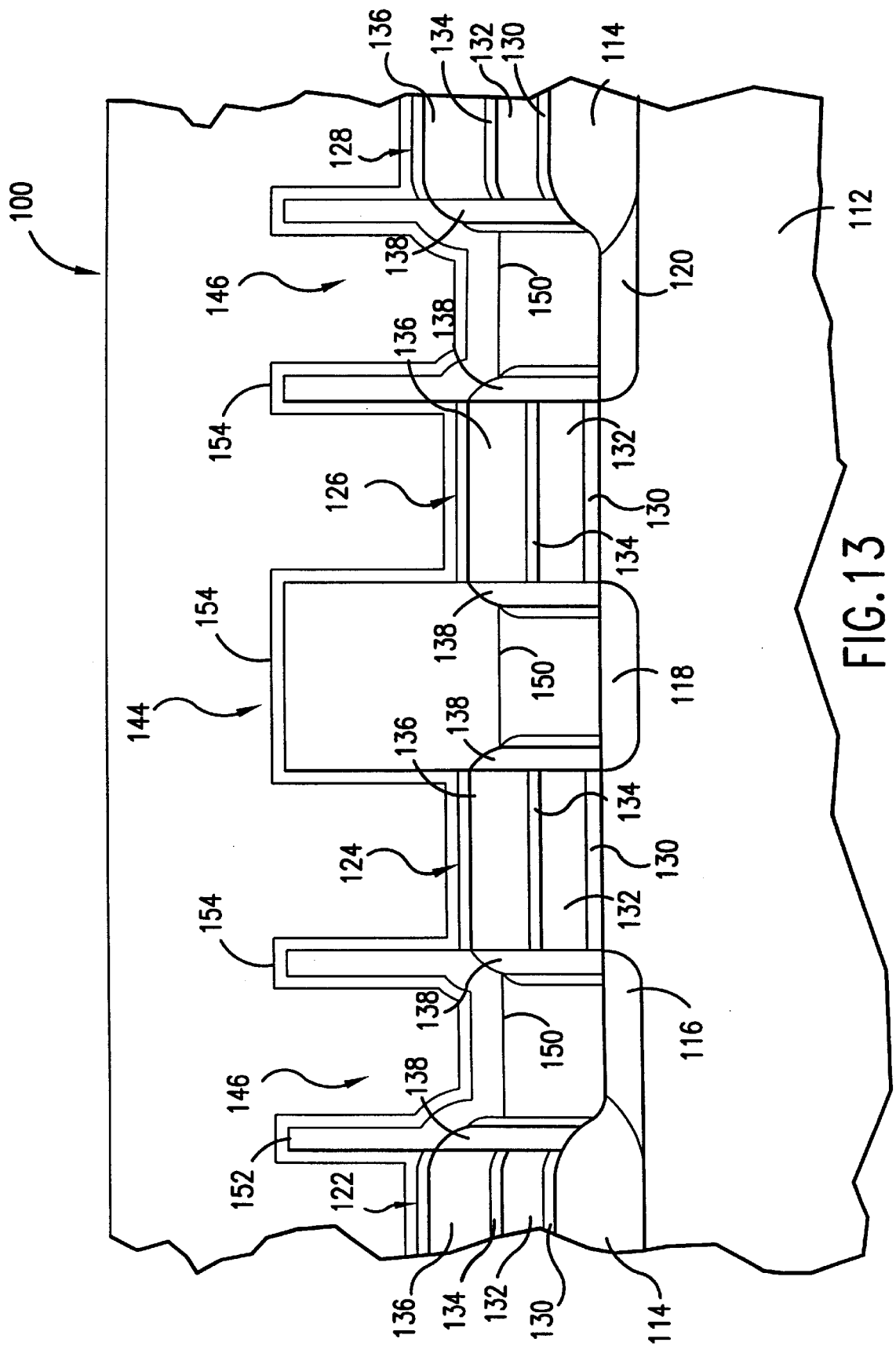
FIG. 13 is a diagrammatic cross-sectional view of a portion of a semiconductor wafer at a processing step subsequent to that shown in FIG. 12.

Referring now to FIG. 13, a capacitor dielectric layer 154 is provided over conductive layer 152, bit line contact 144 and capacitor container openings 146. Dielectric layer 154 is deposited with a thickness such that the openings 146 are again not completely filled. Dielectric layer 154 may comprise, for example, a nitride film. Though a nitride film may be formed using various methods, it is preferred to use rapid thermal nitridation (RTN) processing at a temperature ranging from about 600° C. to about 1200° C., preferably between 800° C. and 1000° C. for a time period ranging from about 5 seconds to about 60 seconds, preferably from about 20 seconds to about 60 seconds. The nitride film of the dielectric film layer 154 is formed using RTN in the presence of $NH_3$, hydrazine, an ammonia plasma, or other nitrogen sources in order to form a nitride layer on the conductive layer 152. The dielectric film layer 154 preferably has a thickness of from about 10 to about 50 Angstroms, more preferably from about 15 to about 30 Angstroms. Other preferred dielectric materials such as tantalum pentoxide ($Ta_2O_5$), Strontium Titanate (ST), Barium Strontium Titanate (BST), Lead Zirconium Titanate (PZT), Strontium Bismuth Tantalate (SBT) and Bismuth Zirconium Titanate (BZT) may also be used. Dielectric layer 154 may be deposited by a low-pressure CVD process using $Ta(OC_2H_5)_5$ and $O_2$ at about 430° C., and may be subsequently annealed in order to reduce leakage current characteristics.

Figure 14:
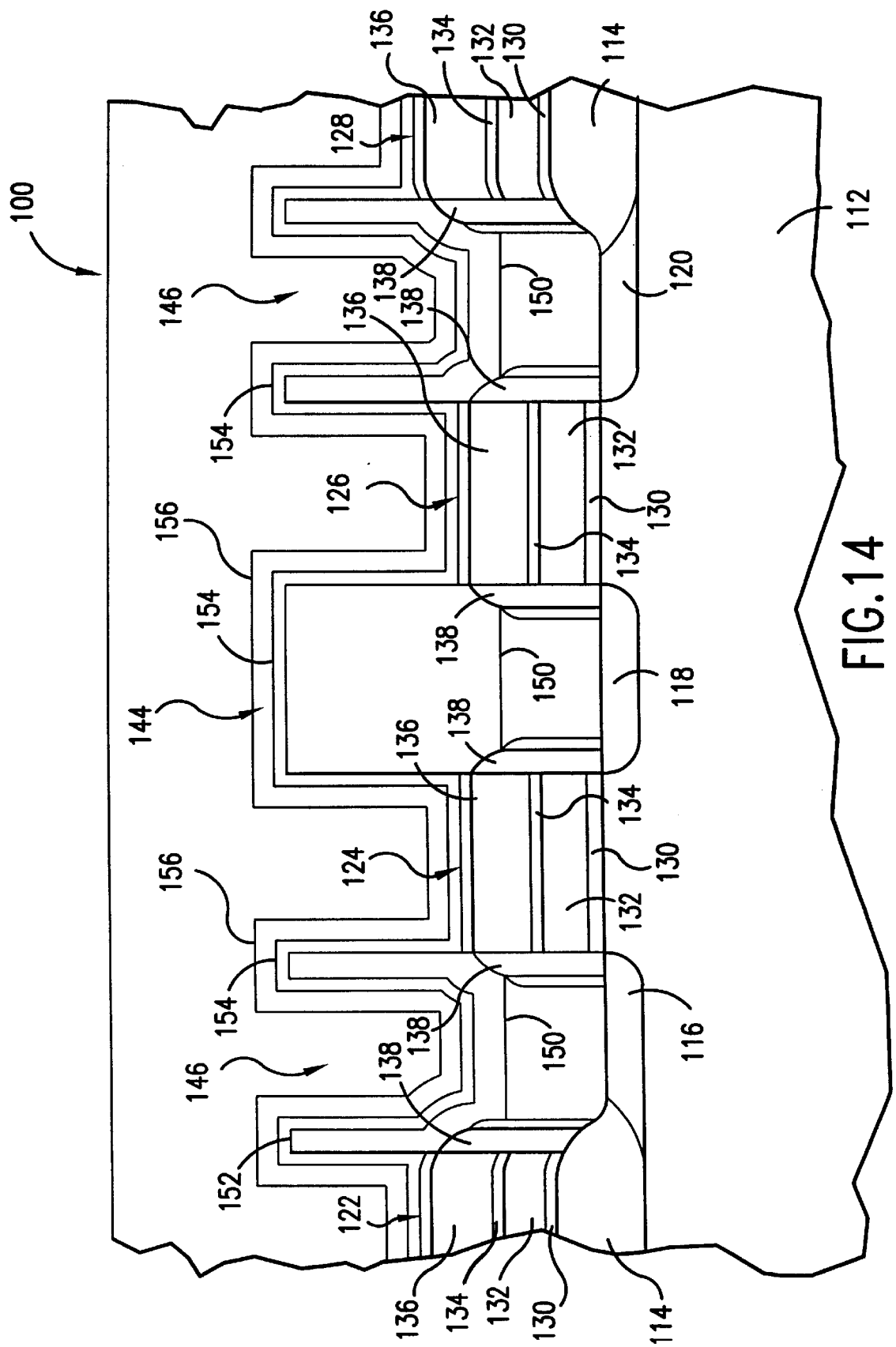
FIG. 14 is a diagrammatic cross-sectional view of a portion of a semiconductor wafer at a processing step subsequent to that shown in FIG. 13.

Referring to FIG. 14, a second conductive electrode layer 156 is then deposited by sputtering or CVD over the dielectric layer 154, again at a thickness which less than completely fills the capacitor openings 146. The only requirement for the selection of the conductive layer 156 is that the metal or alloy form an oxide that is also conductive. Non-limiting examples of materials that may be used to form the conductive layer 156 are $RuO_2$, Ir, $IrO_2$, Ta, Rh, $RhO_x$, $VO_3$, and alloys, such as Pt—Ru or Pt—Rh. The conductive layer 156 may be deposited by CVD, LPCVD, PECVD, MOCVD, sputtering or other suitable deposition techniques.

If Ru is used as the conductive layer 156, the conductive layer 156 may be formed by first depositing a layer of Ru over the dielectric layer 154 by chemical vapor deposition (CVD)) or any other conformal process. Preferably the conductive layer 156 has a thickness of about 100 to about 1000 Angstroms, more preferably less than 500 Angstroms. The second conductive layer 156 may also be composed of titanium nitride. A poly silicon layer (not shown) may be coated over the second conductive layer 156. In addition to serving as the second plate or corresponding electrode of the capacitor, the second conductive layer 156 also forms the interconnection lines between the second plates of the capacitors.

Figure 15:
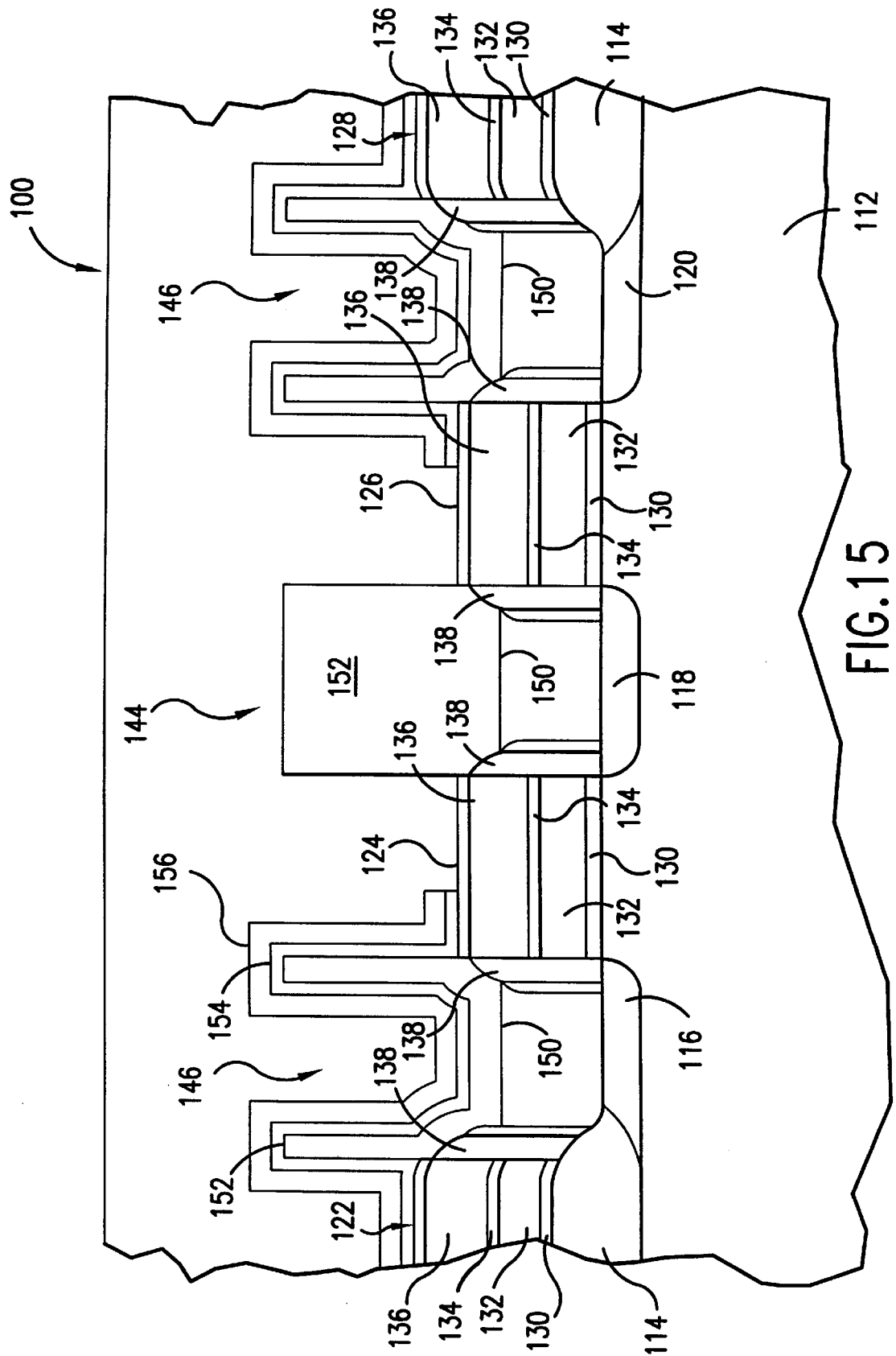
FIG. 15 is a diagrammatic cross-sectional view of a portion of a semiconductor wafer at a processing step subsequent to that shown in FIG. 14.

Referring to FIG. 15, the second conductive layer 156 and underlying capacitor dielectric layer 154 are patterned and etched such that the remaining portions of each group of the first conductive layer 152, capacitor dielectric layer 154, and second conductive layer 156 over each capacitor opening 146 are electrically isolated from each other. In this manner, each of the active areas 116, 118, 120 are also electrically isolated (without the influence of the gate). Furthermore, the first conductive layer 152 in contact with the plug 150 over the bit line active area 118 is outwardly exposed.

Figure 16:
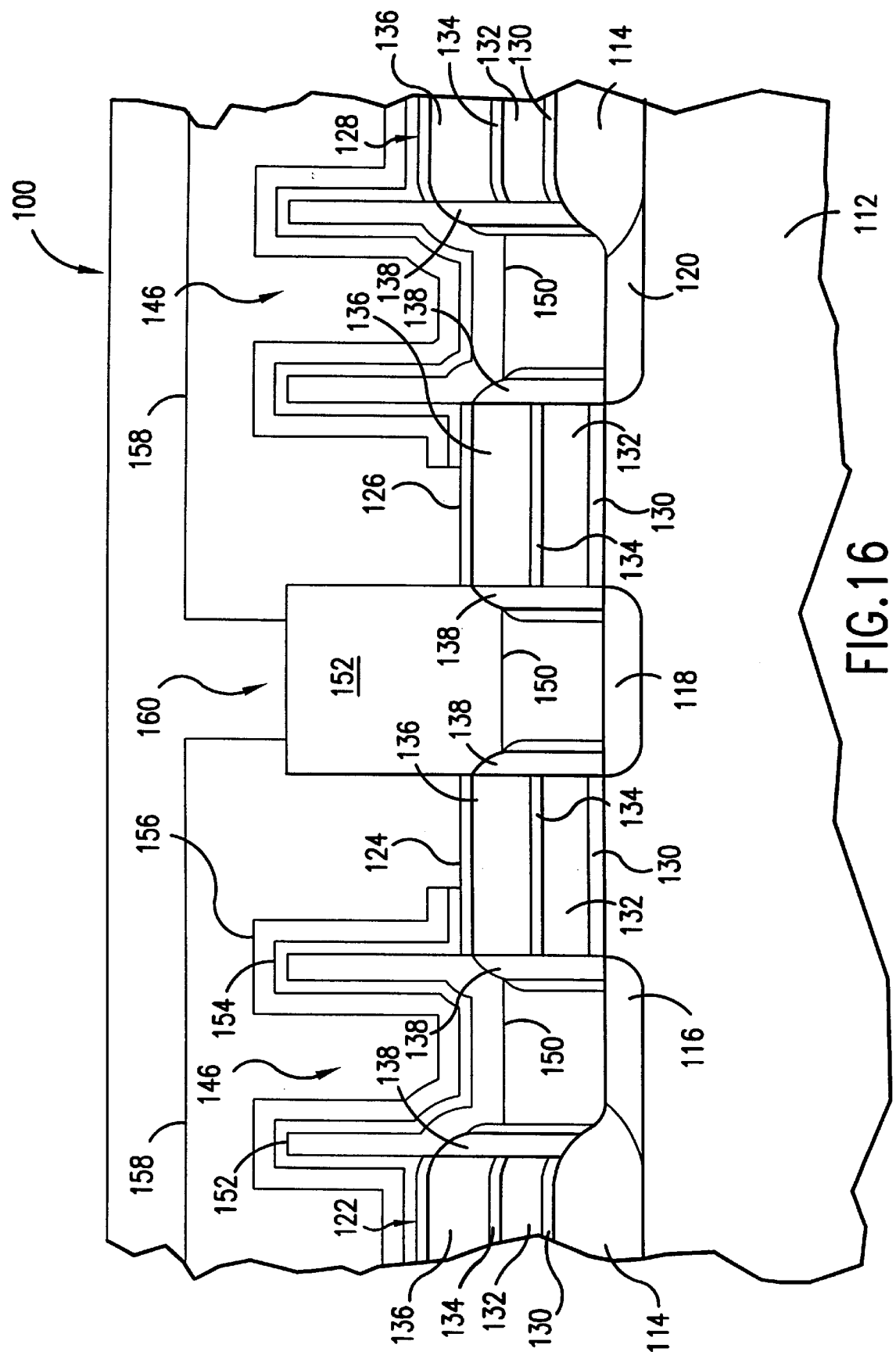
FIG. 16 is a diagrammatic cross-sectional view of a portion of a semiconductor wafer at a processing step subsequent to that shown in FIG. 15.

Referring now to FIG. 16, a bit line insulating layer 158 is provided over the second conductive layer 156 and into the bit line contact opening 144. The bit line insulating layer 158 is preferably comprised of BPSG. The BPSG is typically reflowed by conventional techniques, i.e., heating to about 800° C. Other insulating layers such as PSG, or other compositions of doped $SiO_2$ may similarly be employed as the insulating layer 158.

A bit line contact opening 160 is patterned through the bit line insulating layer 158 such that the second conductive layer in contact with the plug layer 150 is once again outwardly exposed. Then a bit line contact is provided in the bit line contact opening 160 such that the bit line contact is in electrical contact with the conductive plug layer 150. Thus, the outwardly exposed portion of the plug 150 over the active area 118 common to both FETs acts as a bit line contact.

Figure 1:
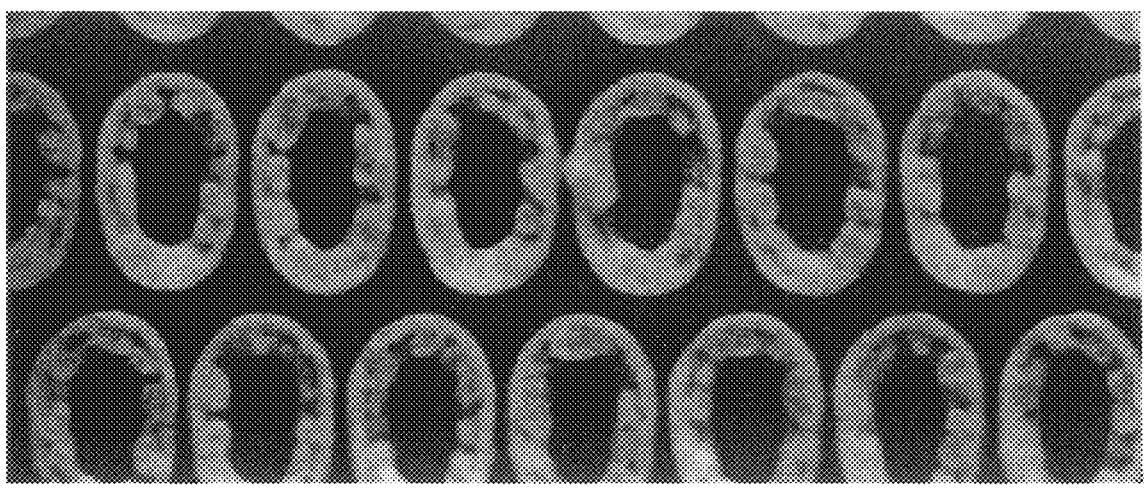
FIG. 1 is an SEM of a substrate containing an array of container capacitors and a floating grain defect causing a short between two adjacent capacitors.
Figure 2:
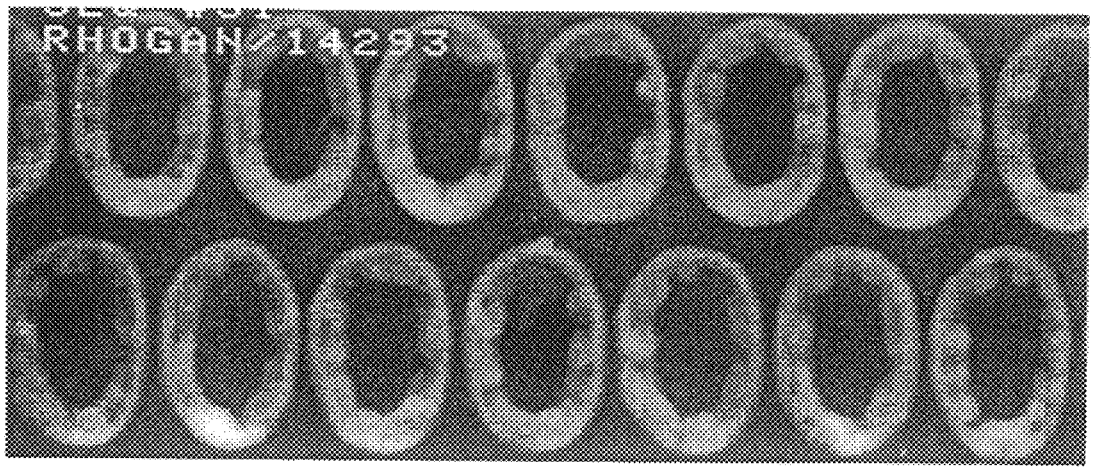
FIG. 2 is an SEM of a substrate containing an array of container capacitors prepared by the method of the present invention.
Figure 17A:
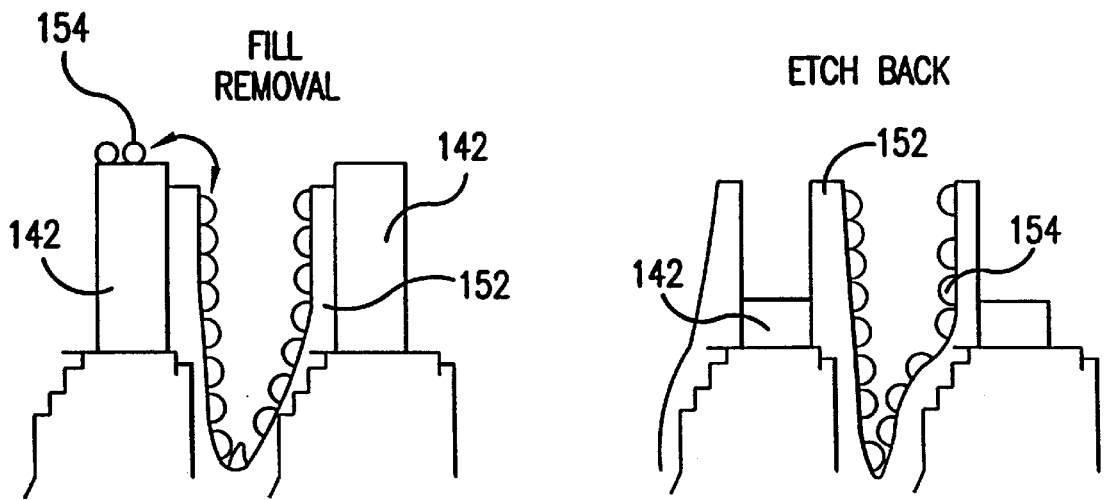
FIG. 17 is a schematic representation of a portion of the process flow of the method of the invention (FIG. 17a) and of the conventional method (FIG. 17b).
Figure 17B:
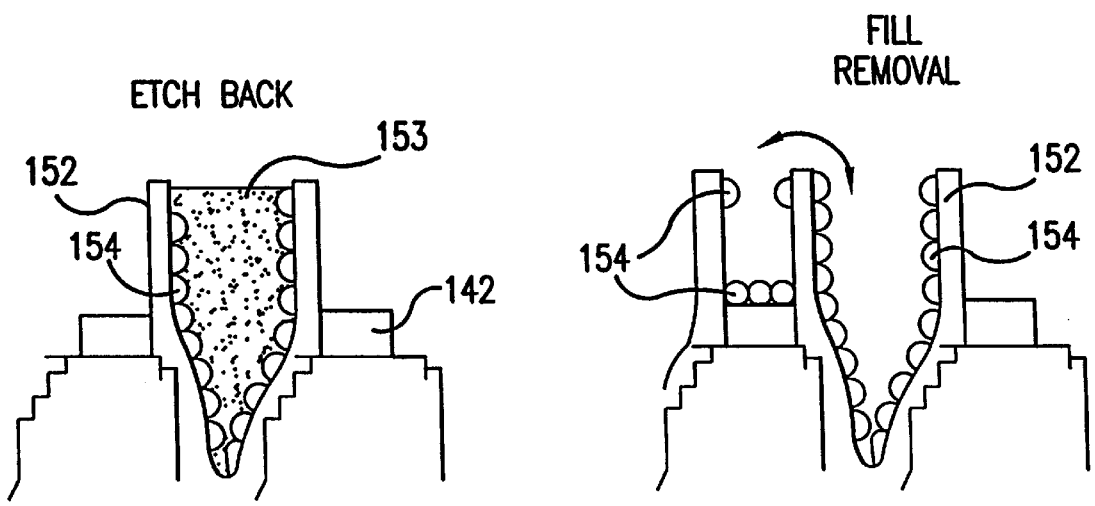

By following the fabrication process described above, capacitor short circuits are prevented or at least minimized as a result of the etchback of insulative material 142 after fill material 153 is removed from the capacitor opening. This is shown schematically in FIG. 17 and in actual SEM photographs as depicted in FIGS. 1 and 2. As shown in FIG. 17a, introduction and removal of the fill material 153 lifts off the HSG or other conductive grains 154 that are free standing within the container. These floating grains 154 will then either reside between the containers or will be diluted into the fill removal solution. In the conventional process as shown in FIG. 17b wherein the etchback of insulative material 142 outside the container is performed before the fill 153 removal, the floating grains 154 that do not dilute into solution will reside on the wafer between capacitors. The resulting shorted capacitors are as shown in FIG. 1. However, by the process of the invention as shown in FIGS. 17a and 2, floating grains 154 will reside on the insulative material 142 which is then subject to an etchback, thus also removing these residual grains and minimizing floating grain defects.

It should again be noted that although the invention has been described with specific reference to DRAM memory circuits and stacked dual-sided container capacitors in such DRAM circuits, the invention has broader applicability and may be used in any integrated circuit requiring a dual-sided container capacitor. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method of forming an array of DRAM cells having dual-sided container capacitors, the method comprising the steps of:

forming a plurality of container forms in a layer of dielectric material, the layer of dielectric material having an upper surface;

disposing a layer of rough polysilicon within the container forms and over the upper surface of the layer of dielectric material;

disposing a layer of photoresist over the first layer of rough polysilicon;

removing the layer of photoresist and the first layer of polysilicon from the upper surface of the layer of dielectric material using chemical mechanical planarization;

removing the layer of photoresist remaining in the plurality of container forms;

wet etching the layer of dielectric material to recess the dielectric below the upper surface of the container forms after removing the layer of photoresist in the container forms;

disposing a nitride film over the layer of rough polysilicon and over the upper surface of the substrate; and disposing a conductive layer over the nitride film.

2. The method of claim 1 wherein the layer of dielectric material comprises borophosphosilicate glass.

3. The method of claim 1 wherein the step of wet etching comprises applying an etch containing hydrofluoric acid.

4. The method of claim 1 wherein the nitride film is formed by rapid thermal nitridation.

* * * * *